(12) United States Patent
Kanamaru et al.

(10) Patent No.: US 7,966,531 B2
(45) Date of Patent: Jun. 21, 2011

(54) MEMORY DIAGNOSIS APPARATUS

(75) Inventors: Hiroo Kanamaru, Tokyo (JP); Takuya Ishioka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 338 days.

(21) Appl. No.: 12/093,562

(22) PCT Filed: Sep. 20, 2006

(86) PCT No.: PCT/JP2006/318568
§ 371 (c)(1),
(2), (4) Date: Sep. 4, 2008

(87) PCT Pub. No.: WO2007/055068
PCT Pub. Date: May 18, 2007

(65) Prior Publication Data
US 2009/0089631 A1    Apr. 2, 2009

(30) Foreign Application Priority Data
Nov. 14, 2005 (JP) .................................. 2005-329309

(51) Int. Cl.
*G11C 29/00* (2006.01)
(52) U.S. Cl. ........................................................ 714/719
(58) Field of Classification Search ............... 714/718, 714/719, 720; 365/200, 201
See application file for complete search history.

(56) References Cited

U.S. PATENT DOCUMENTS

| | | | |
|---|---|---|---|
| 5,107,501 A | 4/1992 | Zorian | |
| 5,396,619 A | 3/1995 | Walton | |
| 5,537,632 A * | 7/1996 | Gorshe | 714/42 |
| 6,496,950 B1 * | 12/2002 | Zhao et al. | 714/718 |
| 6,829,736 B1 | 12/2004 | Marinissen et al. | |
| 6,934,205 B1 * | 8/2005 | Pandey et al. | 365/201 |
| 7,117,406 B2 * | 10/2006 | Onodera | 714/718 |
| 2003/0182607 A1 * | 9/2003 | Onodera | 714/719 |
| 2004/0151017 A1 | 8/2004 | Kawasaki | |
| 2008/0137456 A1 | 6/2008 | Shimosaka | |

FOREIGN PATENT DOCUMENTS

| | | |
|---|---|---|
| CN | 1523367 A | 8/2004 |
| CN | 1681048 A | 10/2005 |
| JP | 61-222100 A | 10/1986 |
| JP | 62-122000 A | 6/1987 |
| JP | 2602204 B2 | 6/1987 |
| JP | 2520234 B2 | 11/1987 |
| JP | 03-101000 A | 4/1991 |

(Continued)

OTHER PUBLICATIONS

Huang, D.C.; Jone, W.B.; , "A parallel transparent BIST method for embedded memory arrays by tolerating redundant operations," Computer-Aided Design of Integrated Circuits and Systems, IEEE Transactions on , vol. 21, No. 5, pp. 617-628, May 2002 doi: 10.1109/43.998632.*

(Continued)

*Primary Examiner* — Cynthia Britt
(74) *Attorney, Agent, or Firm* — Sughrue Mion, PLLC (57) ABSTRACT

A memory diagnosis apparatus include an intra-word testing unit that tests for a coupling fault in each bit in each word in a memory, an inter-word testing unit that tests for a coupling fault between words in each sub-array each being plural words in the memory, and an inter-block testing unit that tests for a coupling fault between sub-arrays in the memory.

10 Claims, 8 Drawing Sheets

FOREIGN PATENT DOCUMENTS

| | | |
|---|---|---|
| JP | 04-228199 A | 8/1992 |
| JP | 05-342113 A | 12/1993 |
| JP | 07-073665 A | 3/1995 |
| JP | 3570388 B2 | 10/2002 |
| JP | 2003-141897 A | 5/2003 |
| JP | 2005-050393 A | 2/2005 |
| KR | 940011427 B1 | 12/1994 |
| TW | 588373 B | 5/2004 |
| TW | 223275 A1 | 8/2004 |

OTHER PUBLICATIONS

Gang-Min Park; Hoon Chang; , "An extended march test algorithm for embedded memories," Test Symposium, 1997. (ATS '97) Proceedings., Sixth Asian , vol., No., pp. 404-409, Nov. 17-19, 1997 doi: 10.1109/ATS.1997.643990.*

Thaller, K.; , "A highly-efficient transparent online memory test," Test Conference, 2001. Proceedings. International , vol., No., pp. 230-239, 2001 doi: 10.1109/TEST.2001.966638.*

Rajsuman, R.; , "Algorithms to test PSF and coupling faults in random access memories," Memory Testing, 1993., Records of the 1993 IEEE International Workshop on , vol., No., pp. 49-54, Aug. 9-10, 1993 doi: 10.1109/MT.1993.263150.*

Official Action issued in corresponding Taiwanese patent application No. 095136911, dated Oct. 14, 1999.

Official Action issued in corresponding Chinese Application No. 200680042518.5, dated Nov. 5, 2010.

* cited by examiner

MEMORY DIAGNOSIS APPARATUS

CROSS REFERENCE TO RELATED APPLICATIONS

This application is a National Stage of International Application No. PCT/JP2006/318568 filed on Sep. 20, 2006, claiming priority based on Japanese Patent Application No. 2005-329309, filed Nov. 14, 2005, the contents of all of which are incorporated herein by reference in their entirety.

TECHNICAL FIELD

The present invention relates to a memory diagnosis apparatus that automatically diagnoses a failure in a memory of a sequence control apparatus or the like.

BACKGROUND ART

It is necessary to perform memory diagnosis at least once a day in embedded systems, such as emergency-stop sequence-control apparatuses, for which high reliability is demanded. Therefore, there has been a need for a memory diagnosis system that is fast and that has high diagnostic accuracy.

A coupling fault is a type of failures in a memory (RAM) in which when data is read or written from or in a memory cell, data values of other memory cells change. Methods such as Walkpath or Galpat (Galloping Pattern test) can be used to diagnose a coupling fault. In Walkpath, zeros are uniformly written in all the memory cells of a memory area to be tested. Then, data in a certain target memory cell of one bit is inverted to 1, and it is checked whether the data in the remaining memory area (background) are correct. The target memory cell is then read again to check whether the data in the target memory cells is correct, and if the data in the target memory cells is correct, the data in the target memory cell is inverted back to zero. This process is repeated for all the memory cells in the memory area. Then, 1 are uniformly written in all the memory cells of the memory area and the same process is repeated. Thus, in Walkpath, one inverted element is inserted into a memory area in which data are uniformly written, and whether data of all the remaining cells are correct is checked. In Galpat, unlike Walkpath, each time a memory cell other than a target memory cell is read, the inverted memory cell (target memory cell) is read to check whether the data in the inverted memory is correct.

Another conventional memory diagnosis method is described in Patent Document 1, for example. In the method described in Patent Document 1, test data AAAAh are written at addresses 55h and AAh in a memory, test data 5555h are written at the other addresses, and then data are successively read from the memory. Data read from the address 55h or AAh is compared with the test data AAAAh, and data read from the other addresses are compared with the test data 5555h. When these data coincide with each other, the memory is determined to be normal, and when these data do not coincide with each other, the memory is determined to have a failure. In the method of Patent Document 1, if the memory has a failure in which the 7-th bit is fixed to zero, for example, the original address AAh will change to 2Ah. Accordingly, the test data AAAAh is overwritten at the address 2Ah, so that the data AAAAh is read and output from the address 2Ah. Thus, the data will not coincide with the expected value 5555h, and therefore a failure of the corresponding address line can be detected.

Patent Document 1: Japanese Patent No. 3570388

DISCLOSURE OF INVENTION

Problem to be Solved by the Invention

In the method of Patent Document 1, however, diagnosis on a coupling fault between bit cells in test data being composed of plural bits is not performed. Therefore, there is a problem that the diagnostic accuracy is low. Moreover, because this technique process only a pair of address values having an inverted relation, a width of test data of one time should be equal to or smaller than a width of memory data. Accordingly, the processing speed cannot be increased by increasing the test data width.

It is possible in Walkpath or Galpat to identify a pair of addresses in which a coupling fault occurs; however, the number of accesses to the memory increases and therefore a time required for the diagnosis increases because writing of test patterns at addresses and reading test to all addresses should be repeated. For example, when the memory size is N bits, N-squared order of memory accesses is required. Therefore, when the memory size is equal to or larger than a megabit, the time required for the diagnosis exceeds several tens of hours. Accordingly, Walkpath or Galpat cannot be applied directly to the sequencer system that requires regular memory diagnosis as described above.

The present invention has been achieved in view of the problem mentioned above, and an object of the present invention is to provide a memory diagnosis apparatus that can diagnose a memory failure at high speeds while keeping a certain level of diagnostic accuracy.

Means for Solving Problem

To solve the above problems and to achieve the above objects, according to the present invention, a memory diagnosis apparatus that diagnoses a failure in a memory includes an intra-block testing unit that tests for a failure with respect to each bit in each block in the memory; and an inter-block testing unit that tests for a failure between blocks in the memory.

Moreover, according to the present invention, a memory diagnosis apparatus that diagnoses a failure in a memory includes an intra-word testing unit that tests for a failure with respect to each bit in each word in the memory; an inter-word testing unit that tests for a failure between words in each sub-array each including plural words in the memory; and an inter-block testing unit that tests for a failure between sub-arrays in the memory.

Effect of the Invention

According to the present invention, the diagnosis of a failure in the memory is performed hierarchically by the intra-block test and the inter-block test. Therefore, a position where a failure occurs can be identified in units of words with less number of memory accesses and shorter diagnosis time as compared with Walkpath or Galpat. Consequently, the memory diagnosis can be implemented in an interval between executions of regular applications.

According to the present invention, the diagnosis of a failure in the memory is performed hierarchically by the intra-word test, the inter-word test, and the inter-sub-array test. Therefore, a position where a failure occurs can be identified in units of sub-arrays with less number of memory accesses and shorter diagnosis time as compared with the typical meth-

EXPLANATIONS OF LETTERS OR NUMERALS

11 CPU
12 bus
13 test area in random access memory
14 save area in random access memory
15 nonvolatile memory
16 register

BEST MODE(S) FOR CARRYING OUT THE INVENTION

Exemplary embodiments of a memory diagnosis apparatus according to the present invention will be explained below in detail with reference to the accompanying drawings. The present invention is not limited to the following embodiments.

First Embodiment

Figure 1:
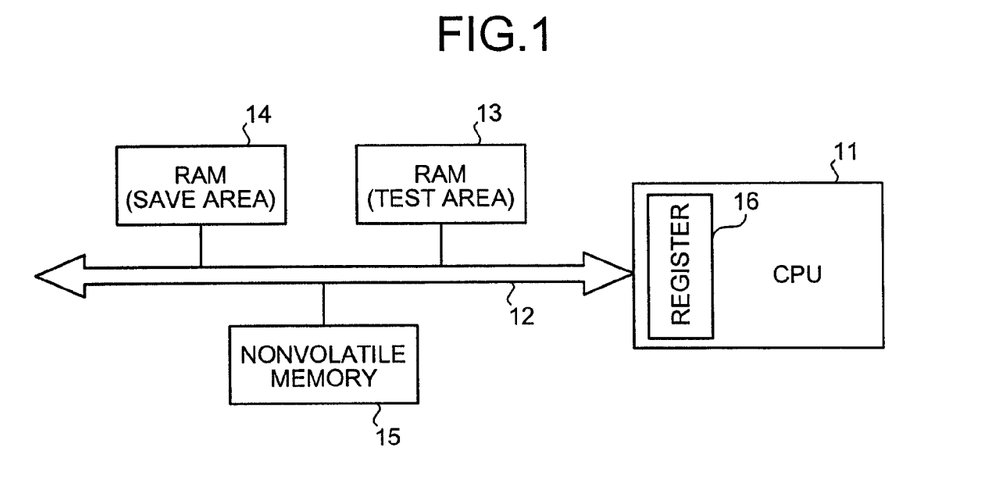
FIG. 1 is a block diagram of a memory diagnosis apparatus according to an embodiment of the present invention.

FIG. 1 depicts a configuration for performing memory diagnosis according to the present invention. As shown in FIG. 1, a test area 13 and a save area 14 in a random access memory (RAM) are connected to a central processing unit (CPU) 11 through a bus 12. The CPU 11 executes application software for system control stored in a nonvolatile memory 15. The nonvolatile memory 15 stores a memory diagnosis program, which is described in detail below. When performing the memory diagnosis, the CPU 11 executes the memory diagnosis program stored in the nonvolatile memory 15. The CPU 11 has a register 16 for writing test data in the test area 13. The test area 13 and the save area 14 are shown as separate memories in FIG. 1; however, the test area 13 and the save area 14 can be configured as different areas in one memory.

Figure 2:
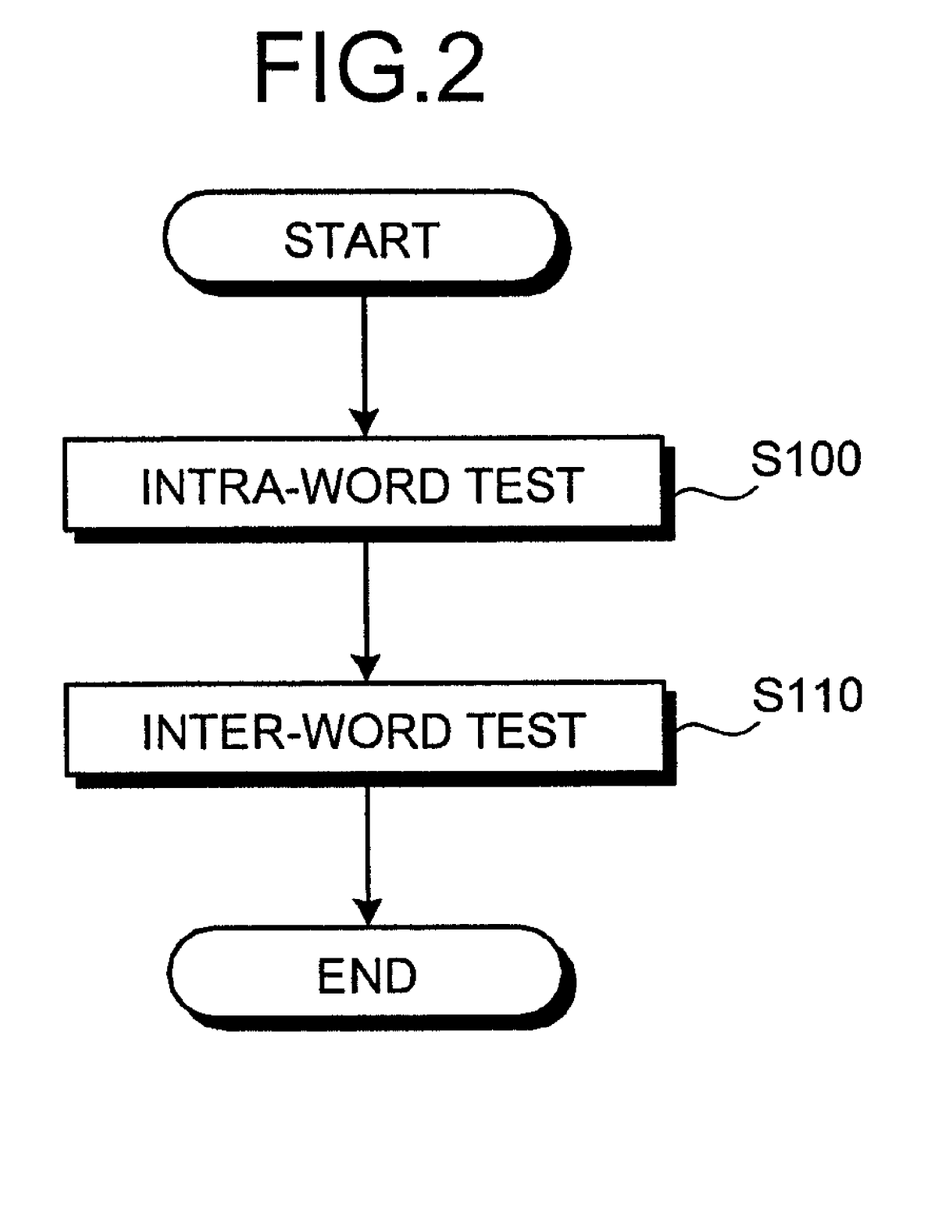
FIG. 2 is a process chart for conceptually depicting a memory diagnosis process according to a first embodiment of the present invention.

FIG. 2 depicts a memory diagnosis process procedure according to a first embodiment. In the first embodiment, diagnosis is performed by dividing the test area 13 into two layers, that is, words and the whole. In other words, in the first embodiment, a failure including a coupling fault between corresponding bits in a word is tested first (step S100), and a failure including a coupling fault between words is tested thereafter (step S110).

A procedure of testing for a coupling fault between bits in a word is explained with reference to FIG. 3. First, it is tested whether there is no coupling fault between bits included in a first word in the test area 13. Before performing a memory diagnosis process for the first word, however, data of the first word stored in the test area 13 is previously backed up in the save area 14. Subsequently, the register 16 is initialized to zero, and a least significant bit is set at 1 (step S200). The register value (0000 . . . 001) is written in the first word of the test area 13 (step S210). The relevant word (first word in this case) is read from the test area 13 and it is checked whether the read value is equal to the register value (step S220). The value of the register 16 is then bit-shifted (step S240) and the bit-shifted register value (0000 . . . 010) is written in the first word of the test area 13. The data value is read (step S210) to check whether the read data value is equal to the register value (step S220). Such diagnosis is repeated until 1 is shifted to a most significant bit (step S230). If the register value and the read memory word value are different, it means that the corresponding memory word includes a coupling fault. An error report is issued upon detecting a coupling fault (step S295). The diagnosis mentioned above can be performed at a stretch or intermittently.

The register 16 is then initialized to 1, and the least significant bit is set at zero (step S250). This register value (1111 . . . 110) is written in the first word of the test area 13 (step S260), and the relevant word (first word in this case) is read from the test area 13 and it is checked whether the read value is equal to the register value (step S270). The value of the register 16 is then bit-shifted (step S290), and the bit-shifted register value (1111 . . . 101) is written in the first word of the test area 13. The data value is read (step S260) to check whether the read data value is equal to the register value (step S270). Such diagnosis is repeated until zero is shifted to the most significant bit (step S280). If the register value and the read memory word value are different, it means that the corresponding memory word includes a coupling fault. An error is issued upon detecting a coupling fault (step S295). When the diagnosis on the first word is completed, the data of the first word is restored from the save area 14 to the test area 13. With this method, it can be tested whether a coupling fault exists between bits in the first word.

The intra-word test to the first word is completed in this way. Similar inter-word test is performed for all words in the test area 13. Once the inter-word test for all words in the test area 13 is completed, an inter-word test as described below can be performed hereafter by setting the first word as a test-target word.

Figure 3:
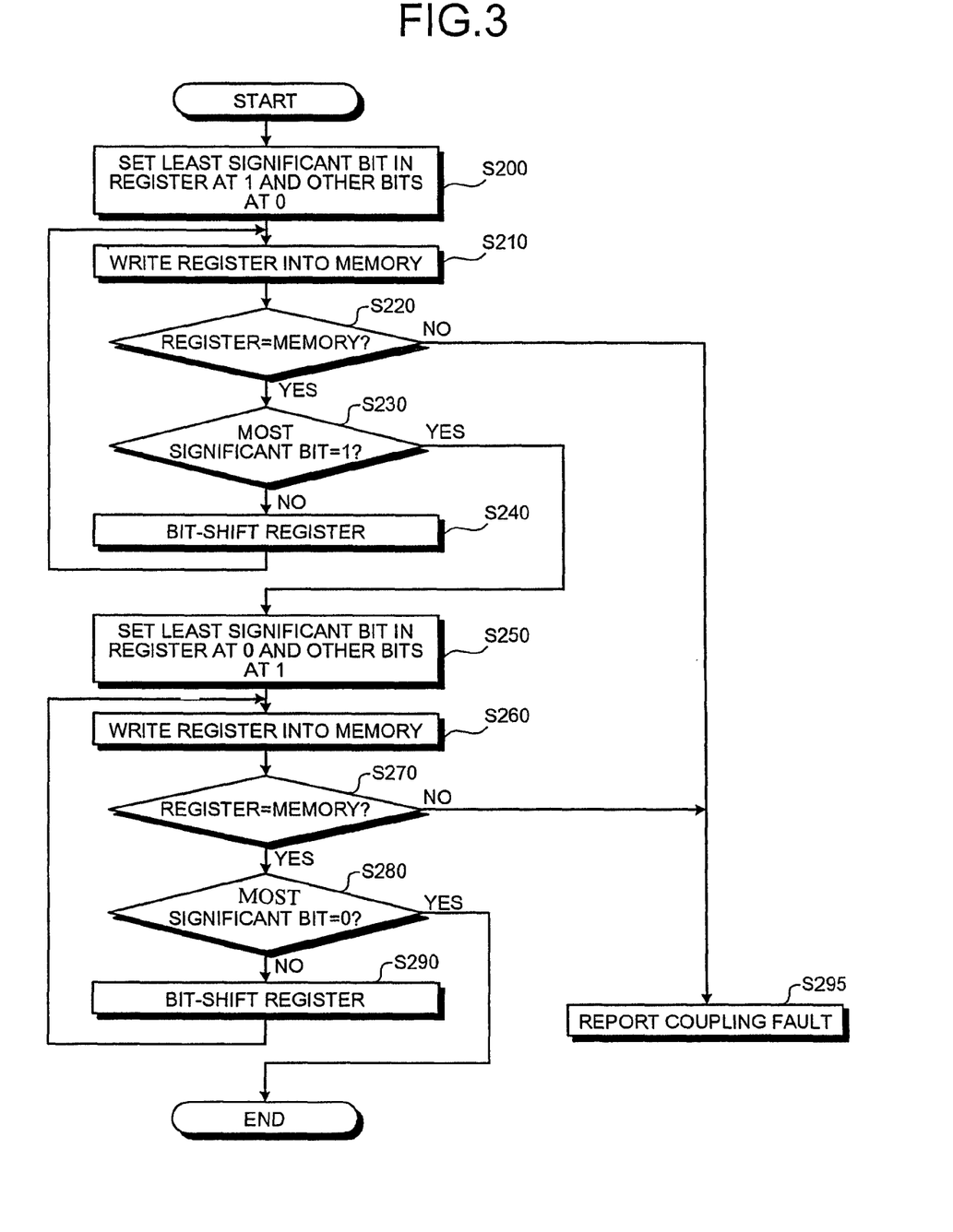
FIG. 3 is a flowchart of an intra-word test procedure in memory diagnosis according to the first embodiment.

In the explanations of FIG. 3, the intra-word test is performed from the least significant bit. However, the intra-word test can be performed from the most significant bit. Moreover, entire word can be first initialized to 1 and then initialized to zero, to perform the intra-word test. The intra-word test can be alternatively performed by initializing a test-target word with a specific pattern such as AAAAh and 5555h, and performing the comparison between the specific pattern and data read from the word with respect to plural specific patterns that are obtained by bit shifting. The point is to write zero or 1 in each bit of a word and confirm that the other bits are not affected.

When the intra-word test to all the words is completed, an inter-word test is performed to test whether no coupling fault occurs between two words in the test area 13. The inter-word test procedure is explained with reference to FIG. 4. Before beginning the inter-word test, data stored in the test area 13 is backed up in the save area 14.

Figure 4:
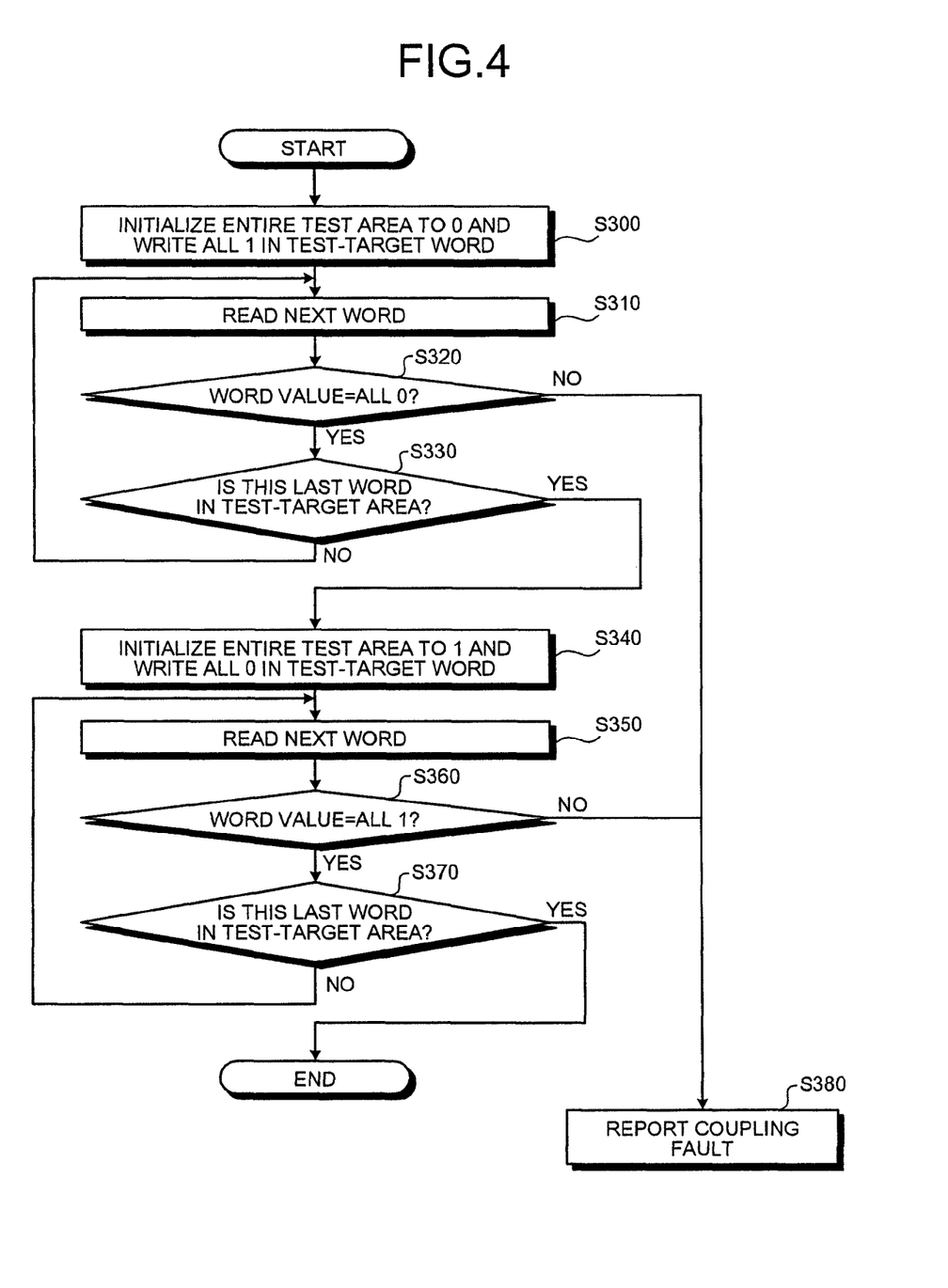
FIG. 4 is a flowchart of an inter-word test procedure in the memory diagnosis according to the first embodiment.

To begin with, the entire test area 13 is initialized to zero and 1 is then written in all bits of a test-target word, to which the intra-word test has been performed (step S300). Storage data of the other words in the test area 13 is read one after another, to confirm that the read data value is all zero (steps S310 to S330). If any of the read data values includes 1, it means that a coupling fault occurs between a word of which the data value includes 1 and the test-target word. An error report is issued upon detecting a coupling fault (step S380).

Subsequently, the entire test area 13 is initialized to 1, and then zero is written in all bits of the test-target word (step S340). Storage data of the other words in the test area 13 is read one after another, to confirm that the read data value is all 1 (steps S350 to S370). If any of the read data values includes zero, it means that a coupling fault occurs between a word of which the data value includes zero and the test-target word. An error report is issued upon detecting a coupling fault (step S380). With this method, it can be tested whether a coupling fault occurs between a test-target word and the other words.

Then, a word at the next address is taken as the test-target word and similar test is repeated for the test-target word. The entire test area 13 can be diagnosed by performing the inter-word test to all words in the test area 13 successively from the first word. Upon completion of the inter-word test, the memory values are restored from the save area 14 to the test area 13. The CPU 11 resumes an operation as the embedded system.

Figure 5:
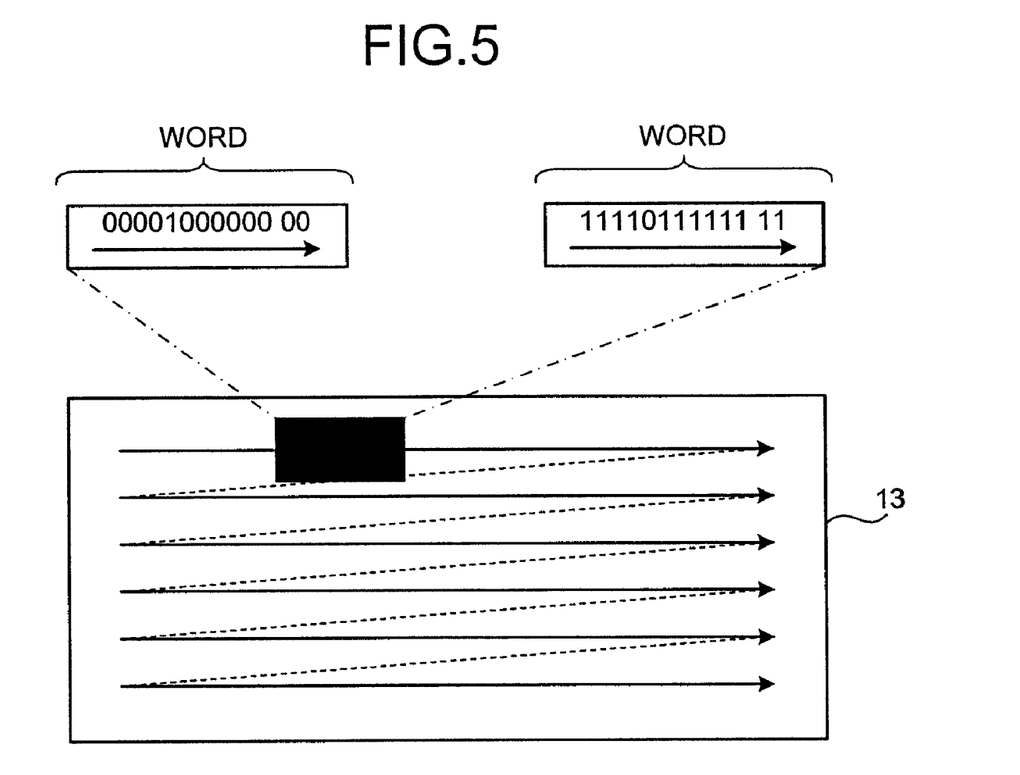
FIG. 5 is a conceptual diagram of the memory diagnosis according to the first embodiment.

FIG. 5 conceptually depicts the memory diagnosis procedure according to the first embodiment. The inter-bit test is performed for each test-target word beginning from the first word to the last word using two bit shift patterns of 1-bit shift and 0-bit shift. The entire test area is first initialized to zero, and then 1 is written in all bits of a test-target word to perform a test for coupling faults between the test-target word and the other words. The entire test area is then initialized to 1, and zero is written in all bits of the test-target word to perform a test for coupling faults between the test-target word and the other words. This is repeated for all words.

Assuming that the memory size of the test area 13 is N bits, the typical Walkpath or Galpat requires $N^2$ memory accesses to diagnose the test area of N bits. Assuming that one word is composed of L bits, the method according to the first embodiment requires $L^2 \times (N/L)$ accesses in the intra-word test and $(N/L)^2$ accesses in the inter-word test, and therefore requires $L^2 \times (N/L) + (N/L)^2$ accesses in total. When $N=L^2$, the method according to the first embodiment achieves a speed about L times higher.

It is explained above that the intra-word test is first performed for all words, and the inter-word test is performed to all the words upon completion of the intra-word test. However, the intra-word test and the inter-word test can be alternately performed to every word. Specifically, when the intra-word test to one word is completed, the inter-word test is performed by setting the word that has been subjected to the intra-word test as a test-target word, the intra-word test to a subsequent word is then performed, and the inter-word test is performed by setting the subsequent word that has been subjected to the intra-word test as a test-target word. Moreover, the intra-word test and the inter-word test can be alternately performed for plural words rather than for a single word. Specifically, the intra-word test can be performed at a stretch for a predetermined number of words (for example, eight words) one after another, then the inter-word test can be performed at a stretch for the plural words that have been subjected to the intra-word test one after another, the intra-word test can be performed at a stretch for the predetermined number of subsequent words (for example, eight words) one after another, and then the inter-word test can be performed at a stretch for the plural words that have been subjected to the intra-word test one after another. Words to be subjected to the inter-word test can be selected in any order as long as the words have been subjected to the intra-word tests. During the inter-word test, the test at steps S300 to S330 in FIG. 4, which is performed by setting all values of the test-target word at 1 and setting all values of the other words at 0, can be performed by setting the test-target word to all words successively from the first word to the last word, and thereafter the test at step S340 to S370 in FIG. 4, which is performed by setting all values of the test-target word at 0 and setting all values of the other words at 1, can be performed by setting the test-target word to all words successively from the first word to the last word.

Arbitrary test patterns can be selected as the initialization pattern and the test pattern for the test-target word. When a coupling fault occurs between bits of the initialization value and the test pattern for the test-target word, both bits being 1 or zero, such a coupling fault fails to be detected. Accordingly, the initialization pattern and the test pattern for the test-target word should be ones having bit values in an inverted relation with each other, such as AAAAh and 5555h.

In the embodiment mentioned above, the CPU 11 does not perform a process other than the diagnosis until the test of the test area 13 is completed. This is because a memory (the test area 13) in which the CPU 11 performs the process is filled with diagnostic data. Interrupted sequence information indicating up to which sequence among predetermined memory diagnosis sequences the memory diagnosis is completed can be recorded in the save area 14 or the nonvolatile memory 15 in timing when the CPU 11 wants to handle the process other than the diagnosis, for example an application in the embedded system. In this way, the CPU 11 can resume the diagnosis by referring to the interrupted sequence information, after copying data of the save area 14 into the test area 13 to perform the process other than the diagnosis and then copying again the data of the test area 13 into the save area 14.

When the intra-word test and the inter-word test are alternately performed for every word for example, completed word information indicating up to which word from the head the tests have been completed is recorded in the save area 14 or the nonvolatile memory 15 before the CPU 11 performs the process other than the diagnosis. The CPU 11 copies data of the save area 14 into the test area 13, and performs the process other than the diagnosis. When resuming the memory diagnosis, the CPU 11 copies the data of the test area 13 into the save area 14, and resumes the test by setting a word following the recorded completed word as the test-target word. Accordingly, the memory diagnosis can be implemented in a time-divided manner. Therefore, the memory diagnosis can be performed between application processes, so that the application processes are not delayed.

When the data of the test area 13 is first copied into the save area 14, the CPU 11 accesses the save area 14 during the application process and accesses the test area 13 during the memory diagnosis. Upon completion of the memory diagnosis, the CPU 11 copies the data of the save area 14 into the test area 13, and switches addresses of the test area 13 and the save area 14. In this way, the need to copy the data between the test area 13 and the save area 14 when the memory diagnosis is performed in the time-divided manner is eliminated, so that the speed can be further increased.

In the first embodiment, the memory coupling diagnosis is performed hierarchically by the intra-word test and the inter-word test. Therefore, a position in which a failure occurs can be identified in units of words (more specifically, the present method cannot detect a coupling fault over plural words), while the number of memory accesses is decreased and the time required for the diagnosis is reduced as compared with Walkpath or Galpat. Accordingly, the memory diagnosis can be performed between applications of the embedded system. When an address of a word of which the inter-word test is completed is recorded at a temporally interruption of the diagnosis and the test is resumed from the recorded address at resume of the diagnosis, the memory diagnosis can be implemented in a time-divided manner.

In the first embodiment, the intra-word test and the inter-word test are performed in units of words. Alternatively, an intra-block test and an inter-block test can be performed in units of arbitrary blocks. The blocks include a sub-array, which is described later, as an amount of memory corresponding to one word or plural words, for example.

Second Embodiment

Figure 6:
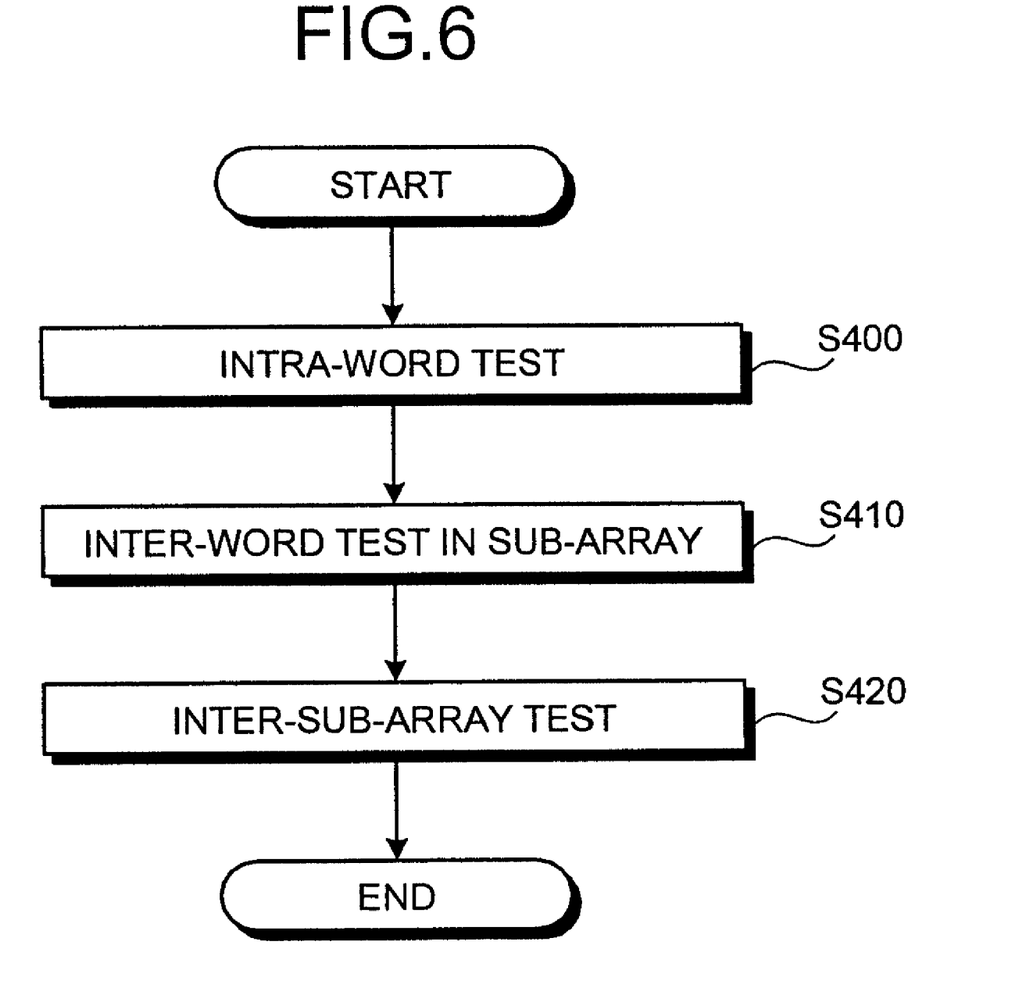
FIG. 6 is a process chart for conceptually depicting a memory diagnosis process according to a second embodiment of the present invention.
Figure 7:
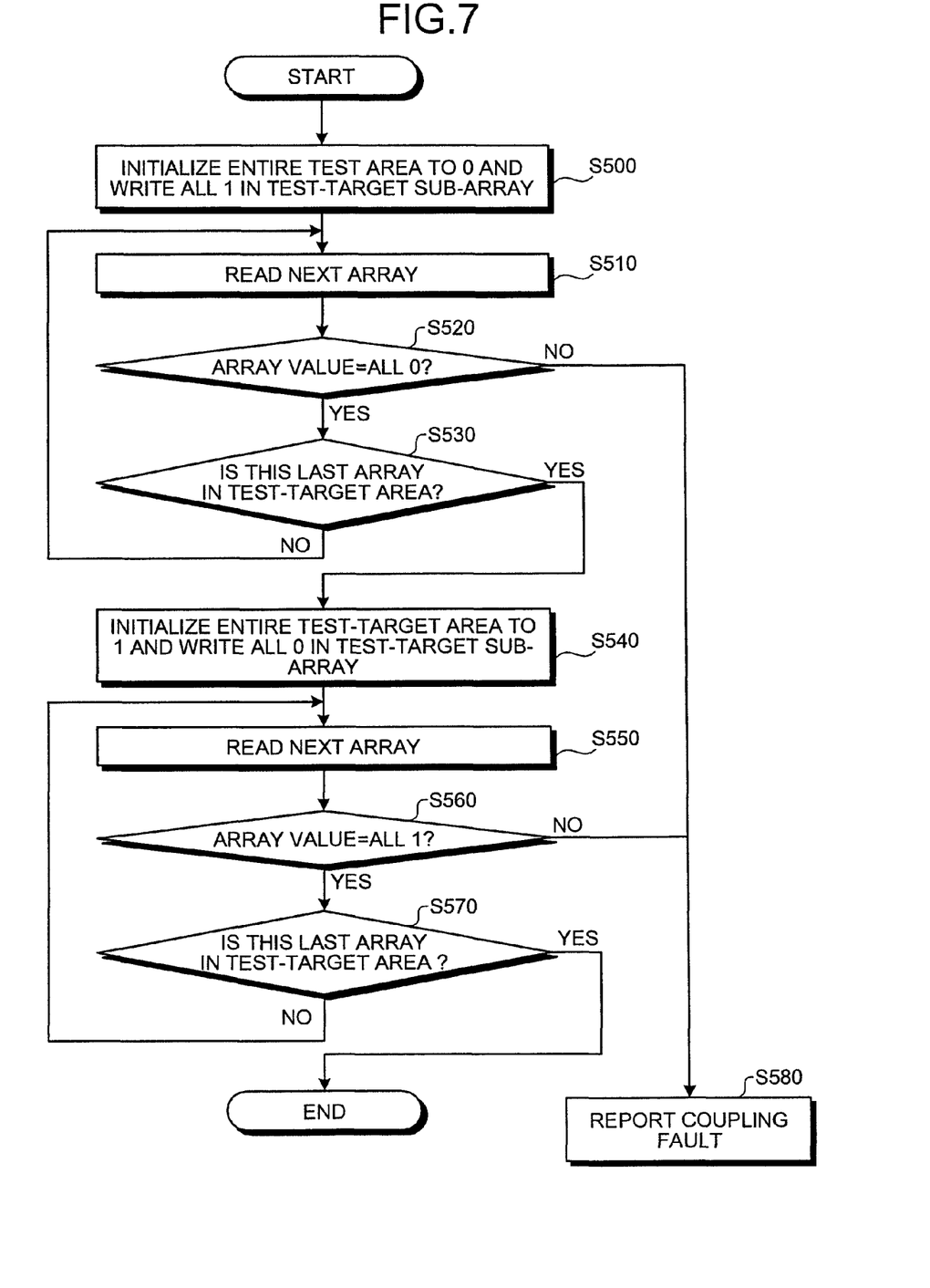
FIG. 7 is a flowchart of an inter-sub-array test procedure in memory diagnosis according to the second embodiment.

A second embodiment of the present invention is explained with reference to FIGS. 6 to 8, and the like. FIG. 6 depicts a memory diagnosis process procedure according to the second embodiment. In the second embodiment, the memory diagnosis is performed by dividing a memory into three layers, that is, a word, a sub-array (array), and the entire memory. A sub-array means an amount of memory corresponding to plural words. Specifically, in the second embodiment, failures including a coupling fault between bits in a word are first tested (step S400), and then failures including a coupling fault between words in a sub-array are tested (step S410). Failures including a coupling fault between sub-arrays are tested at the end (step S420).

Before beginning the intra-word test, data stored in a first sub-array of the test area 13 is backed up in the save area 14. Concerning a first word in the first sub-array of the test area 13, the intra-word test is performed in the same manner as explained above with reference to FIG. 3. When a result of the intra-word test is normal, the inter-word test in the sub-array is performed in the same manner as explained above with reference to FIG. 4, with regarding the test-target word (the first word in this case) in the first sub-array as the test-target word, to test for whether no coupling fault occurs between the test-target word and the remaining words of the sub-array that includes the test-target word.

The intra-word test to the word following the first word in the first sub-array of the test area 13 is performed in the same manner as explained above with reference to FIG. 3. When a result of the intra-word test is normal, the inter-word test in the sub-array is performed in the same manner as explained above with reference to FIG. 4, with regarding the test-target word (the word following the first word in this case) in the first sub-array as the test-target word, to test for whether no coupling fault occurs between the test-target word and the remaining words in the sub-array that includes the test-target word. The intra-word test and the inter-word test are hereinafter performed to each of words in the first sub-array in the same manner.

An inter-sub-array test is performed to test for whether no coupling fault occurs between the test-target sub-array (the first sub-array in this case) and the remaining sub-arrays. The inter-sub-array test procedure is explained with reference to FIG. 7. Before beginning the inter-sub-array test, the storage data in the test area 13 is backed up in the save area 14.

To begin with, the entire test area 13 is initialized to zero, one sub-array to which the inter-sub-array test has been subjected is set as a test-target sub-array, and 1 is written in all bits of the test-target sub-array (step S500). Data stored in sub-arrays other than the test-target sub-array in the test area 13 are read one after another, to confirm that the read data value is all zero (steps S510 to S530). If the read data value includes 1, it means that a coupling fault occurs between a sub-array of which the data value includes 1 and the test-target sub-array. An error report is issued upon detecting a coupling fault (step S580).

Subsequently, the entire test area 13 is initialized to 1, and then zero is written in all bits of the test-target sub-array (step S540). Storage data of the sub-arrays other than the test-target sub-array in the test area 13 are read one after another, to confirm that the read data value is all 1 (steps S550 to S570). If any of the read data value includes zero, a coupling fault occurs between a sub-array of which the data value includes zero and the test-target sub-array, and thus an error report is issued (step S580). The processes mentioned above can diagnose that no coupling fault occurs between one sub-array to be tested and the other sub-arrays.

The intra-word test and the inter-word test are performed to the next sub-array in the same manner as mentioned above. The inter-sub-array test as mentioned above is performed by setting this sub-array as the test-target sub-array. When such processes are successively performed for all sub-arrays in the test area 13, a coupling fault diagnosis concerning the entire test area 13 can be implemented. Upon completion of the test to the entire memory, the memory values are restored from the save area 14 to the test area 13. The CPU 11 resumes the operation as the embedded system.

Figure 8:
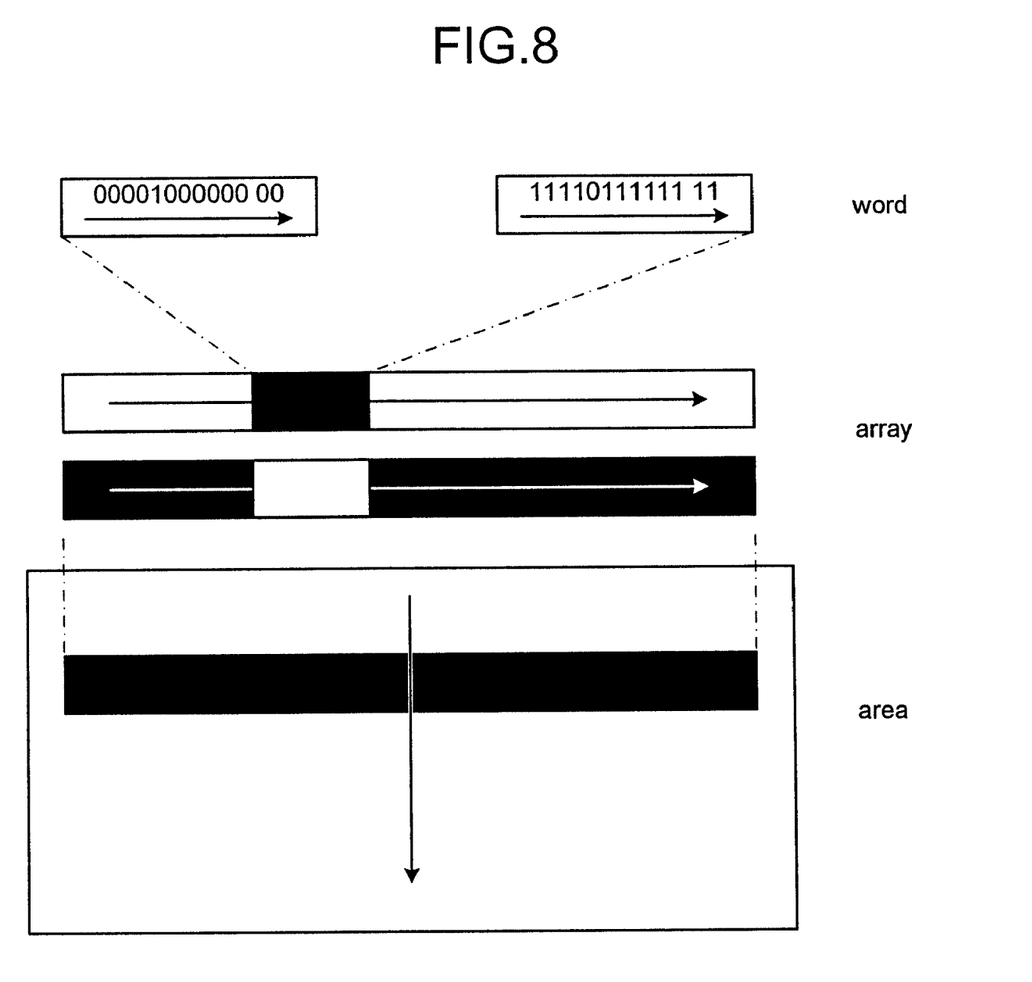
FIG. 8 is a conceptual diagram of the memory diagnosis according to the second embodiment.

FIG. 8 conceptually depicts a memory diagnosis procedure according to the second embodiment. The intra-word test is performed to each word in the first sub-array, and the inter-word test is performed to the first sub-array. The entire test area is initialized to perform the inter-sub-array test. The intra-word test, the inter-word test, and the inter-sub-array test area repeatedly performed to all sub-arrays in the test area, so that the test of the entire test area is completed.

Assume that the test area 13 includes N sub-arrays each being composed of M words. Walkpath or Galpat requires $(M \times N)^2$ memory accesses in addition to the intra-word test, to diagnose the test area of MN words. The method according to the second embodiment requires $N \times (M^2)$ memory accesses in the inter-word test to the sub-arrays and $N \times (NM)$ memory accesses in the inter-sub-array test, $N \times (M^2) + N \times (NM)$ memory accesses in total. When $M = N = 1000$, that is, for a 1-megaword memory, the method according to the second embodiment requires the number of memory accesses that is one thousandth of that according to the typical method.

It is explained above that the intra-word test and the inter-word test are alternately performed in one sub-array. However, the inter-word test to each of words in one sub-array can be performed after completing the intra-word test to all the words in the sub-array. The intra-word test and the inter-word test can be alternately performed for plural words in one sub-array. Words to be subjected to the inter-word test can be selected in any order as long as the words have been already subjected to the intra-word test. During the inter-word test of one sub-array, the test at steps S300 to S330 shown in FIG. 4, which is performed by setting all values of the test-target word at 1 and all values of the other words at zero, can be performed by setting all words in one sub-array one after another from the first word to the last word as the test-target word, and the test at steps S340 to S370 shown in FIG. 4, which is performed by setting the all values of the test-target word at zero and the all values of the other words at 1, can be performed by setting all words in one sub-array one after another from the first word to the last word as the test-target word.

It is also possible to first perform the intra-word tests to all words in the test area, perform all of the inter-word tests in each sub-array, and then perform the inter-sub-array test. Sub-arrays to be subjected to the inter-sub-array test can be selected in any order as long as the sub-arrays have been already subjected to the inter-word test.

Arbitrary test patterns can be selected for the initialization pattern and the test pattern for the test-target word. However, when a coupling fault occurs between bits of the initialization value and the test pattern of the test-target word, both bits being 1 or zero, such a coupling fault fails to be detected. Accordingly, the initialization pattern and the test pattern for the test-target word should be ones having bit values in an inverted relation with each other, such as AAAAh and 5555h. Similarly, arbitrary patterns can be selected as the initialization pattern and the test pattern for the test-target sub-array. In addition, in this case, patterns having bit values in an inverted relation with each other should be adopted.

Even in the second embodiment, interrupted sequence information indicating up to which sequence among predetermined memory diagnosis sequences the memory diagnosis is completed can be recorded in the save area 14 or the nonvolatile memory 15 in timing when the CPU 11 wants to handle a process other than the diagnosis, for example an application in the embedded system. Accordingly, after copying data from the save area 14 to the test area 13 and performing the process other than the diagnosis, the CPU 11 can copy the data from the test area 13 into the save area 14 again, and resume the diagnosis with referring to the interrupted sequence information.

For example, a completed word indicating up to which word from the head the test is completed is recorded in the save area 14 or the nonvolatile memory 15 before the CPU 11 performs the process other than the diagnosis. The CPU 11 copies data of the save area 14 into the test area 13, and performs the process other than the diagnosis. When resuming the memory diagnosis, the CPU 11 copies the data in the test area 13 into the save area 14, and resumes the test with regarding a word following the recorded completed word as the test-target word. Instead of the word for which the inter-word test is completed, an address of a sub-array for which the inter-sub-array test is completed can be recorded. Such processes achieve the memory diagnosis in a time-divided manner. Accordingly, the memory diagnosis can be performed between application processes, so that the application processes are not delayed.

When the data of the test area 13 is first copied into the save area 14, the CPU 11 accesses the save area 14 during the application process and accesses the test area 13 during the memory diagnosis. Upon completion of the memory diagnosis, the data of the save area 14 is copied into the test area 13, and addresses of the test area 13 and the save area 14 are switched. Accordingly, the need to copy the data between the test area 13 and the save area 14 when the memory diagnosis is performed in the time-divided manner is eliminated, which further increases the speed of the diagnosis.

Thus, in the second embodiment, the memory coupling diagnosis is performed hierarchically by the intra-word test, the inter-word test, and the inter-sub-array test. Accordingly, a position of a failure is identified in units of sub-arrays (more specifically, the present method cannot detect a position of a coupling fault over plural sub-arrays), while the number of memory accesses is decreased and the time required for the diagnosis is reduced as compared with the typical method. Therefore, the memory diagnosis can be performed between applications of the embedded system. When an address of a word for which the inter-word test is completed or an address of a sub-array for which the inter-sub-array test is completed is recorded at a temporal interruption of the diagnosis, and the test is resumed from the recorded address at resume of the diagnosis, the memory diagnosis can be implemented in a time-divided manner.

INDUSTRIAL APPLICABILITY

The memory diagnosis apparatus according to the present invention is useful in memory diagnosis on an embedded system that requires high reliability, for example an emergency-stop sequence-control apparatus that performs memory diagnosis at least once a day.

The invention claimed is:

1. A memory diagnosis apparatus that diagnoses a failure in a memory, the memory diagnosis apparatus comprising:
    an intra-block testing unit that tests for a failure with respect to each bit in each block in the memory; and
    an inter-block testing unit that tests for a failure between blocks in the memory, wherein
    the intra-block testing unit repeatedly performs a process of writing a predetermined test pattern in a test-target block and then a process of comparing data read from the test-target block and the test pattern while changing the test pattern, and
    the inter-block testing unit repeatedly performs a process of writing a predetermined first test pattern in all the blocks, writing an inverted test pattern that is obtained by inverting the first test pattern in one of the blocks, and then a process of comparing data read from blocks other than the block in which the inverted test pattern is written and the first test pattern while successively changing the block in which the inverted test pattern is written in units of block.

2. The memory diagnosis apparatus according to claim 1, wherein the block includes one word.

3. The memory diagnosis apparatus according to claim 1, wherein the block includes plural words.

4. The memory diagnosis apparatus according to claim 1, wherein the inter-block test unit further repeatedly performs a process of writing a second test pattern that is obtained by inverting the first test pattern in all the blocks, writing an inverted second test pattern that is obtained by inverting the second test pattern in one of the blocks, and then a process of comparing data read from blocks other than the block in which the inverted second test pattern is written and the second test pattern while successively changing the block in which the inverted second test pattern is written.

5. The memory diagnosis apparatus according to claim 1, wherein the inter-block test unit writes the inverted first test pattern in a block that has been subjected to the intra-block test by the intra-block test unit.

6. The memory diagnosis apparatus according to claim 1, wherein the intra-block testing unit selects the test-target block, writes the predetermined test pattern in the test-target block, compares only each bit in the test-target block with respect to the test pattern, and changes one bit in the test pattern and writes the changed test pattern to the test-target block and repeats the comparison.

7. The memory diagnosis apparatus according to claim 6, wherein the test-target block comprises one word.

8. A memory diagnosis apparatus that diagnoses a failure in a memory, the memory diagnosis apparatus comprising:
    an intra-word testing unit that tests for a failure with respect to each bit in each word in the memory;

an inter-word testing unit that tests for a failure between words in each sub-array each including plural words in the memory; and an inter-block testing unit that tests for a failure between sub-arrays in the memory.

9. The memory diagnosis apparatus according to claim 8, wherein the intra-word testing unit repeatedly performs a process of writing a predetermined test pattern in a test-target word and then a process of comparing data read from the test-target word and the test pattern while changing the test pattern, the inter-word testing unit repeatedly performs a process of writing a predetermined first test pattern in one sub-array, writing an inverted first test pattern that is obtained by inverting the first test pattern in one of the words in the sub-array, and then a process of comparing data read from words other than the word in which the first test pattern and the inverted first test pattern is written while successively changing the word in which the first test pattern and the inverted first test pattern is written, and the inter-block testing unit repeatedly performs a process of writing a predetermined second test pattern in the memory, writing an inverted second test pattern that is obtained by inverting the second test pattern in one of the sub-arrays in the memory, and then a process of comparing data read from sub-arrays other than the sub-array in which the second test pattern and the inverted second test pattern is written while successively changing the sub-array in which the second test pattern and the inverted second test pattern is written.

10. The memory diagnosis apparatus according to claim 9, wherein:

the intra-word testing unit selects the test-target word, writes the predetermined test pattern in the test-target word, compares only each bit in the test-target word with respect to the test pattern, and changes one bit in the test pattern and writes the changed test pattern to the test-target word and repeats the comparison, the inter-word testing unit performs a separate test in which said other words are checked to determine that values have not changed, and the inter-block testing unit performs a separate test in which the test pattern is written into the sub-array that comprises a plurality of words and checking other sub-arrays to determine that values have not changed.

* * * * *